United States Patent
Talaga, Jr. et al.

[11] Patent Number: 6,014,048
[45] Date of Patent: Jan. 11, 2000

[54] CLOCK GENERATOR WITH MULTIPLE FEEDBACK PATHS INCLUDING A DELAY LOCKED LOOP PATH

[75] Inventors: Ronald F. Talaga, Jr., Austin, Tex.; Russell Hershbarger, Nevada City, Calif.; James M. Buchanan, Austin, Tex.

[73] Assignee: Advanced Micro Devices, Inc., Sunnyvale, Calif.

[21] Appl. No.: 09/085,509

[22] Filed: May 27, 1998

[51] Int. Cl.[7] .................................................. H03L 7/07
[52] U.S. Cl. ........................ 327/156; 327/292; 327/294
[58] Field of Search ................................... 327/147–150, 327/152, 153, 156–159, 161, 292, 294, 295, 243, 244; 331/1 A, 25

[56] References Cited

U.S. PATENT DOCUMENTS

| | | | |
|---|---|---|---|
| 5,173,617 | 12/1992 | Alsup et al. | 327/159 |
| 5,428,317 | 6/1995 | Sanchez et al. | 331/1 A |
| 5,483,204 | 1/1996 | Tanoi | 327/159 |

OTHER PUBLICATIONS

Weste, et al, "Principles of CMOS VLSI Design: A Systems Perspective," 2nd Ed., pp. 334–336, 356–357 and 364, published by Addison–Wesley Publishing Company, 1993.

*Primary Examiner*—Tuan T. Lam
*Attorney, Agent, or Firm*—Conley, Rose & Tayon; Robert C. Kowert

[57] ABSTRACT

The present invention encompasses the use of multiple feedback paths in a clock source for an integrated circuit device to maintain phase lock to an external clock. It is further contemplated by the present invention that feedback paths are provided from the internal clock distribution path and from a matching path that approximates the delay of the clock distribution path. The matching path may comprise a delay locked loop. Feedback from the clock distribution path is used in normal operation and feedback from the matching path is used when the internal clock distribution path is disabled. The clock source of the present invention also may implement power management functions.

21 Claims, 4 Drawing Sheets

CLOCK GENERATOR WITH MULTIPLE FEEDBACK PATHS INCLUDING A DELAY LOCKED LOOP PATH

BACKGROUND OF THE INVENTION

1. Field of the Invention

This disclosure relates to clock distribution mechanisms in integrated circuit devices and to clock generators using feedback for phase locking. A clock distribution mechanism according to one embodiment involves a clock generator having multiple feedback paths, one of which may include a delay locked loop.

2. Description of the Relevant Art

Recently, frequencies at which integrated circuit devices operate have rapidly increased as semiconductor fabrication processes have advanced. Advances in process technologies have resulted in devices that run at internal clock frequencies much higher than the external clock frequencies of the systems to which such devices are connected. However, if a high-speed device has a synchronous interface to an external system synchronization must be maintained between the external and internal clocks to maintain proper data sampling. To accomplish this and still maintain higher internal clock frequencies, phase locked loop technology has been integrated into such high speed devices. The phase locked loop allows a device to receive an external clock and generate an internal clock that is a multiple of the external clock while maintaining a close phase relationship between the external clock and the internal clock. For example a 33 MHz external clock may be multiplied in a phase locked loop to a 66 MHz internal clock. The phase locked loop keeps the 66 MHz internal clock in phase with the 33 MHz external clock so that every other edge of the 66 MHz internal clock will be approximately in synchronization with a corresponding clock edge of the 33 MHz external clock.

Figure 1:
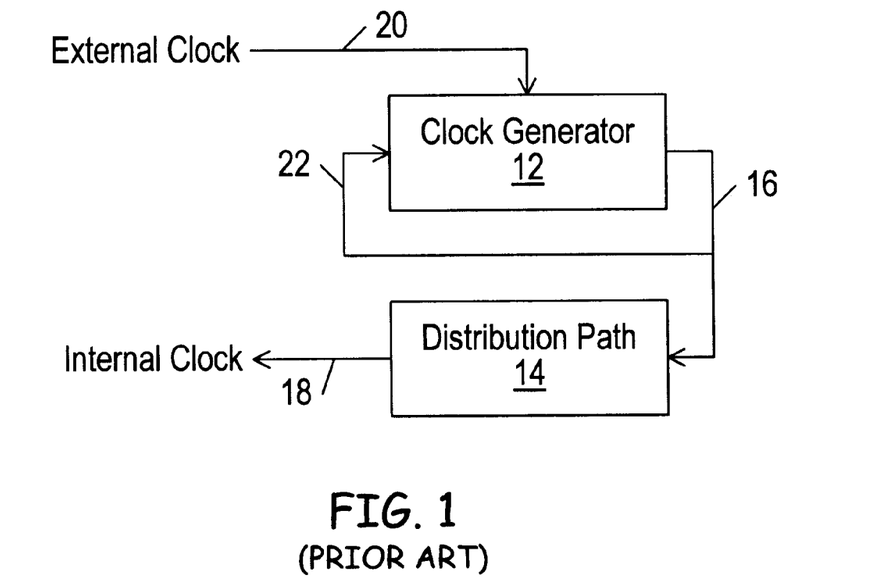
FIG. 1 is a block diagram illustration of a conventional clock generation technique for providing a high-speed internal clock that maintains a phase relationship with an external clock.

FIG. 1 illustrates a prior art clock generation technique for providing a high-speed internal clock 18 that maintains a phase relationship with an external clock 20. The technique of FIG. 1 includes a clock generator 12 that receives external clock 20 and generates a clock signal 16 that is a multiple of external clock 20. Clock signal 16 is fed back to clock generator 12 through feedback path 22. Clock generator 12 may include a phase locked loop that uses feedback clock 22 to maintain a phase lock between external clock 20 and feedback clock 22 so that clock signal 16 is generated substantially in phase with external clock 20. The typical phase locked loop contains a phase detector, an amplifier, and a voltage controlled oscillator. The phase detector compares external clock 20 to feedback clock 22 and generates an output that is a measure of their phase difference. The output measuring the phase error may be filtered and amplified and then used as input to the voltage controlled oscillator to adjust the generated clock signal according to the phase error. Thus, the voltage controlled oscillator will lock to the phase of the external clock maintaining a fixed phase relationship between the external clock and the feedback clock 22. Since clock signal 16 and feedback clock 22 are basically a common signal, the phase of clock signal 22 is also substantially locked to external clock 20. A counter device is connected to the output of the voltage control oscillator to generate clock signal 16 as a multiple of external clock 20.

Clock signal 16 is distributed throughout an integrated circuit device as the internal clock 18 by distribution path 14. Distribution path 14 may incorporate any conventional clock distribution scheme such as a buffered common node, a clock tree or a compressed tree. The larger and more complex the integrated circuit device is the more delay or skew will be introduced to the internal clock 18 by distribution path 14. As a result of this skew, internal clock 18 may become significantly out of phase with external clock 20. If the skew is too large, data errors may result. For example, the integrated circuit device will sample data from the external system based on internal clock 18. However, data may be valid in the external system according to external clock 20. If the skew or phase difference between internal clock 18 and external clock 20 is too large, data may be sampled by the integrated circuit during an invalid state.

Figure 2:
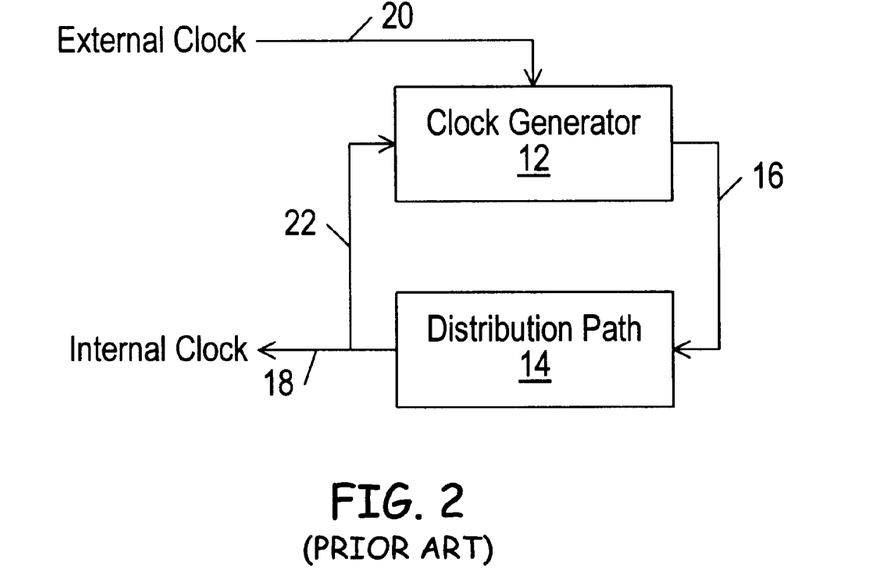
FIG. 2 is a block diagram illustration of another conventional clock generation technique for providing a high-speed internal clock that maintains a phase relationship with an external clock.

FIG. 2 is an example of a prior art clock distribution technique that attempts to solve problems identified with the clock distribution technique of FIG. 1 above. The technique of FIG. 2 is similar to that of FIG. 1 except feedback clock 22 is taken from internal clock 18 instead of the generated clock signal 16. Clock generator 12 will maintain phase lock between feedback clock 22 and external clock 20. Since feedback clock 22 is taken from internal clock 18, a close phase relationship (i.e., "lock") is maintained between internal clock 18 and external clock 20. Therefore, data communications between the external system and the internal interface of the integrated circuit will be in closer synchronization than the technique of FIG. 1, resulting in more accurate data sampling at the I/O interface between the integrated circuit device and the external system.

As integrated circuit devices are operated at higher and higher frequencies they consume higher and higher amounts of power. Excess power consumption can result in heat related circuit errors. Furthermore, in hand held or portable systems reducing power consumption is important to maintain the battery life or operating duration of such systems. One accepted way to control power consumption in an integrated circuit device is to shut off the clock distribution to sections of the integrated circuit device that are not in use. However, for the clock distribution technique of FIG. 2, if the distribution path 14 is disabled then feedback clock 22 will also be disabled. Thus, phase lock will be lost and clock generator 12 will not be able to properly operate. Therefore, one disadvantage of the clock distribution technique of FIG. 2 is that internal clock 18 and distribution path 14 cannot be selectively or periodically disabled.

Figure 3:
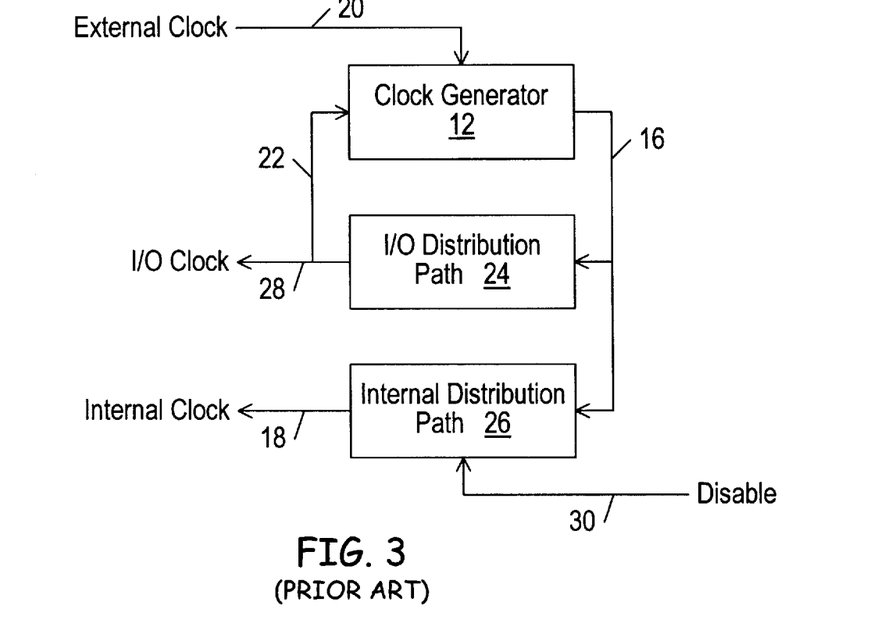
FIG. 3 is a block diagram illustration of another conventional clock generation technique for providing an internal clock an I/O clock that maintains a phase relationship with an external clock.

FIG. 3 is an example of a prior art distribution technique that attempts to solve the above identified problems of the clock distribution techniques of FIGS. 1 and 2. The clock distribution technique of FIG. 3 includes clock generator 12 that receives external clock 20 and generates clock signal 16 similar as in FIGS. 1 and 2. However, the technique of FIG. 3 separates the internal clock distribution into two distinct paths. I/O distribution path 24 provides I/O clock 28 which is used in the I/O interface between the integrated circuit device and the external system. Internal distribution path 26 is used to provide internal clock 18 to the core elements of the integrated circuit device. Feedback clock 22 is taken from I/O clock 28. Thus, clock generator 12 maintains a close phase relation between 10 clock 28 and external clock 20. Therefore, data communications between the I/O buffers of the integrated circuit and the external system are reliably performed. Also, the technique of FIG. 3 provides disable signal 30 for disabling internal distribution path 26 and thus internal clock 18. Internal clock 18 may thus be disabled while maintaining phase lock in the clock generator 12. However, the technique of FIG. 3 has a drawback in that internal clock 18 is not closely phase matched to I/O clock 28 and external clock 20. To overcome this problem double buffering may be used in the I/O interface to synchronize data to the internal clock 18. However, double buffering may require a large amount of additional die area and thus be prohibitive in regard to cost and area. Double buffering also requires an additional clock cycle to propagate data into the device. This delay may cause architectural problems in devices such as microprocessors.

Figure 4:
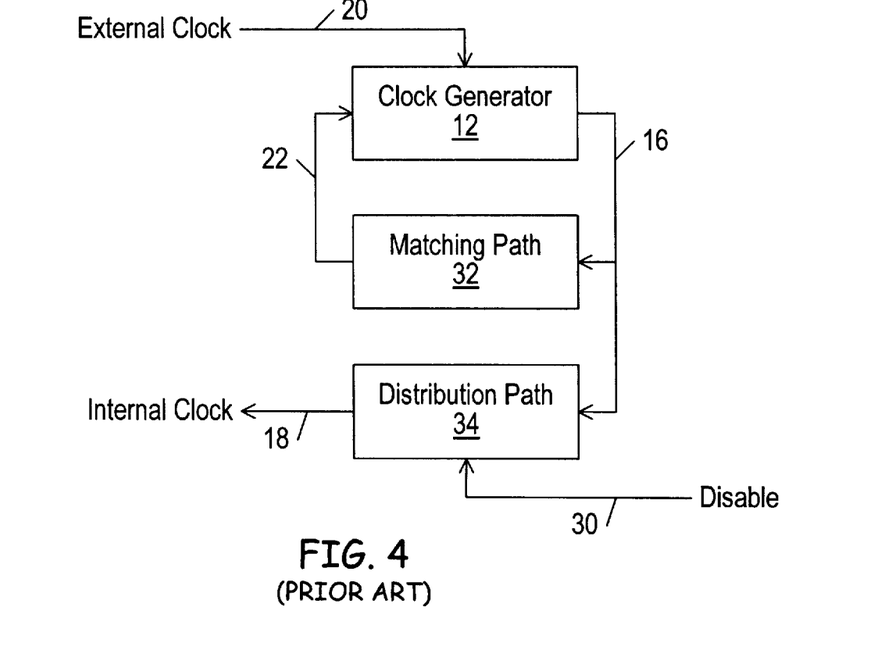
FIG. 4 is a block diagram illustration of another conventional clock generation technique for providing a high-speed internal clock that maintains a phase relationship with an external clock.

FIG. 4 is an example of another prior art technique that attempts to maintain a close phase relationship between the internal and external clocks and also allow the internal clock to be disabled without losing phase lock. The technique of FIG. 4 includes clock generator 12 that generates clock signal 16 as a multiple of external clock 20. Clock signal 16 is distributed throughout the integrated circuit device as internal clock 18 by distribution path 24. Internal clock 18 is used for both core elements and the I/O interface. Clock signal 16 is also routed through matching path 32 to provide feedback clock 22 to the clock generator 12 for maintaining phase lock between feedback clock 22 and external clock 20. Matching path 32 is designed to approximate the delay through distribution path 34. Thus, if the delay from clock signal 16 to feedback clock 22 closely matches the delay from clock signal 16 to internal clock 18 then the phase lock between feedback clock 22 and external clock 20 will also provide a close phase relationship between internal clock 18 and external clock 20. Therefore, the I/O interface of the integrated circuit device will provide accurate data sampling of the external system and double buffering will not be required to synchronize to the core elements.

Furthermore, disable signal 30 is provided to disable internal clock 18 and distribution path 34. Internal clock 18 may be disabled by asserting disable signal 30. However, phase lock is not lost when internal clock 18 is disabled because matching path 32 continues to provide feedback clock 22 to clock generator 12. When disable signal 30 is unasserted a close phase relationship is immediately restored between internal clock 18 and external clock 20. Matching path 32 may be created by routing conductive trace and/or using delay elements to approximate the delay of distribution path 34. However, since matching path 32 is not the actual distribution path for the internal clock, it is very difficult to create an exact delay match. Furthermore, if matching path 32 is created in one localized area of the integrated circuit device it will not approximate process variations across the integrated circuit device. For example, distribution path 34 distributes internal clock 18 across the entire integrated circuit device and thus takes into account variations in line width and other spacings inherent to the fabrication process used to create the integrated circuit device. These process variations cannot be accounted for in a localized matching path. If the integrated circuit device operates at an internal clock frequency of 500 MHz for example, the difference in delay between matching path 32 and distribution path 34 can be significant. In such an example a 200 pico-second difference in delay between matching path 32 and distribution path 34 results in a 10% clock period skew of internal clock 18. Such a skew error may be intolerable in a high frequency design, especially when clock jitter and phase error are also taken into account.

A need therefore exists for a clock distribution technique that overcomes the problems identified in the techniques of FIGS. 1 through 4 above. Thus, it is desirable to have a clock distribution technique that maintains a close phase relation between the internal clock and the external clock at both the core elements and the I/O interface. Furthermore, it is desirable to avoid double buffering at the I/O interface. It is yet further desirable to be able to disable the internal clock without losing phase lock in the clock generator. Finally, it is desirable for the phase relationship between the internal clock and the external clock to be extremely close so that as much of the internal clock period as possible is available in the integrated circuit device for high frequency applications.

SUMMARY OF THE INVENTION

The problems outlined above are in large part solved by an improved clock source and method. The improved clock source uses multiple feedback paths to maintain a close phase relationship between the internal clock and the external clock without losing phase lock when the internal clock is disabled.

One embodiment of the improved clock source contemplates a clock generator adapted to receive an external clock and a feedback clock. The clock generator is further adapted to provide a clock signal and maintain a approximate phase consistency (i.e., a close phase relationship) between the external clock and the feedback clock. The clock generator may be part of an integrated circuit device. A clock distribution path is adapted to receive the clock signal and distribute it to elements within the integrated circuit device. A matching path is also provided to receive the clock signal. The matching path is designed to approximate the clock distribution path so that the delay of the clock signal through the matching path approximates the delay of the clock signal through the clock distribution path. The feedback path provides the feedback clock to the clock generator. The feedback path is adapted to select the feedback clock from either the clock distribution path in a first mode or from the matching path in a second mode. Thus, in the first mode the feedback path is essentially the clock signal as delayed through the clock distribution path and in the second mode the feedback clock is essentially the clock signal as delayed through the matching path.

The feedback path may use a multiplexer to perform the selection for the two modes of operation. The clock generator may include a phase locked loop for maintaining a close phase relationship between the feedback clock and the external clock. In the first mode of operation the feedback clock is essentially the internal clock as delayed through the clock distribution path. Thus, in the first mode of operation the clock generator will operate to maintain a close phase relationship between the internal clock and the external clock. The external clock may be a bus clock from a computer system to which the integrated circuit device is coupled or any other external clock source. The clock generator may provide the clock signal as a multiple of the external clock so that the integrated circuit device may operate at a higher frequency than the external system to which the integrated circuit device is coupled. For example, the integrated circuit device may include a microprocessor core and the clock distribution path may distribute the clock signal to the microprocessor core so that the microprocessor core runs at a higher frequency than the external system bus which provides the external clock.

A disable signal is also provided for disabling the clock distribution path and thus disabling the internal clock. The disable signal may be used for switching between the first mode and second mode of operation for the feedback path. The feedback path may receive the disable signal so that when the disable signal is unasserted the feedback path operates in the first mode and when the disable signal is asserted the feedback path operates in the second mode. Therefore, when the clock distribution path and internal clock are disabled, the matching path will provide the feedback path, and when the clock distribution path and internal clock are not disabled, the feedback clock will be selected from the internal clock as provided by the clock distribution path.

The matching path may approximate the delay of the clock distribution path by using a series of delay elements or an amount of interconnect trace approximating the length of the clock distribution path or a combination thereof. Alternatively, the matching path may include a delay locked loop adapted to match the delay of the clock distribution path. The delay locked loop may include a plurality of delay elements and a comparator. The clock signal passes through the delay elements and is provided to the feedback path and to the comparator. The comparator also receives the internal clock from the clock distribution path. The comparator outputs a signal indicating the difference in delay between the internal clock and the clock signal from the delay elements. The delay locked loop is adapted to adjust the delay to the delay elements by changing the number of delay elements through which the clock signal passes or by varying the current or voltage which controls delay elements or by any other conventional means of adjusting delay in an integrated circuit structure. The output of the comparator is used to adjust the delay through the delay elements so that the delay of the clock signal through the delay elements matches the delay of the clock signal through the distribution path, i.e., the internal clock. Thus, the delay locked loop continually adjusts the delay of the clock signal to the delay elements to match the delay of the internal clock. When the feedback path switches to the second mode of operation the delay is locked or frozen and the clock signal through the delay elements is provided as the feedback clock. In this manner phase lock is maintained during the second mode so that when the feedback path switches back to the first mode the internal clock is immediately restored to a close phase relationship to the external clock.

The clock distribution path may be constructed as any conventional clock distribution technique such as a buffered common mode, a clock tree, or compressed tree. Alternatively, the clock distribution path may include a grid structure of multiple layers of interconnect within the integrated circuit device. For example, the distribution path may be constructed as a grid of metal layers in the integrated circuit device. A plurality of connection points may be provided within the distribution path from which the feedback clock may be selected by the feedback path in the first mode. However, only one of these potential connection points is ultimately configured to provide the feedback clock. The particular connection point which will provide the clock signal from a distribution path to the feedback path may be selected by adjusting a fabrication mask layer such as one of the upper level metal layer masks.

The clock distribution path may also comprise a plurality of distribution structures adapted to be separately disabled for power management. In this embodiment each separate distribution structure may receive its own disable signal. The feedback path selects the feedback clock from one of the plurality of distribution structures in the first mode. If the distribution structure from which the feedback path selects the feedback clock is disabled then the feedback path is switched to the second mode and selects the feedback clock from the clock signal through the matching path. The separate clock distribution structures may be disabled as part of a power management scheme, for example, to conserve power in hand-held or portable applications. Each distribution structure may provide the clock signal as a separate internal clock to different functional units of the integrated circuit device. When certain ones of these functional units are not active the clock distribution structure providing its internal clock may be disabled to conserve power. Also, the clock distribution path may be initially disabled when power is first applied to the integrated circuit device and thus the feedback path may operate in the second mode of operation when power is initially applied. As power ramps up various ones of the individual clock distribution structures may be sequentially enabled. In this manner a large instantaneous current drain is avoided as the integrated circuit device is powered up.

The present invention also contemplates a clock distribution method. The method includes generating a clock signal from an external clock and distributing the clock signal and the integrated circuit device to provide an internal clock. The method also includes delaying the clock signal to provide a matching clock. The delay of the matching clock from the clock signal substantially matches the delay of the internal clock from the clock signal. The method further includes selecting between the internal clock and the matching clock to use for phase locking to said external clock. The method also provides for disabling the internal clock and selecting the matching clock for phase locking during the disabling.

Broadly speaking the present invention contemplates a clock source that includes a clock generator adapted to receive and external clock and a feedback clock and to provide a clock signal. The clock generator is also adapted to maintain a close phase relationship between the external clock and the feedback clock. The clock distribution path is also provided. The clock distribution path is adapted to receive a clock signal and to provide an internal clock by distributing the clock signal. A matching path is provided and is adapted to receive the clock signal and to provide a matching clock. The delay of the matching clock from the clock signal is substantially matched to the delay of the internal clock from the clock signal. Also, a feedback path is provided as adapted to select between the internal clock and the matching clock and to provide the feedback clock to the clock generator. The matching clock is selected when the internal clock is disabled and the internal clock is selected when the internal clock is not disabled. Also, the matching path may include a delay locked loop for more accurate matching of the delay through the clock distribution path.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 5:
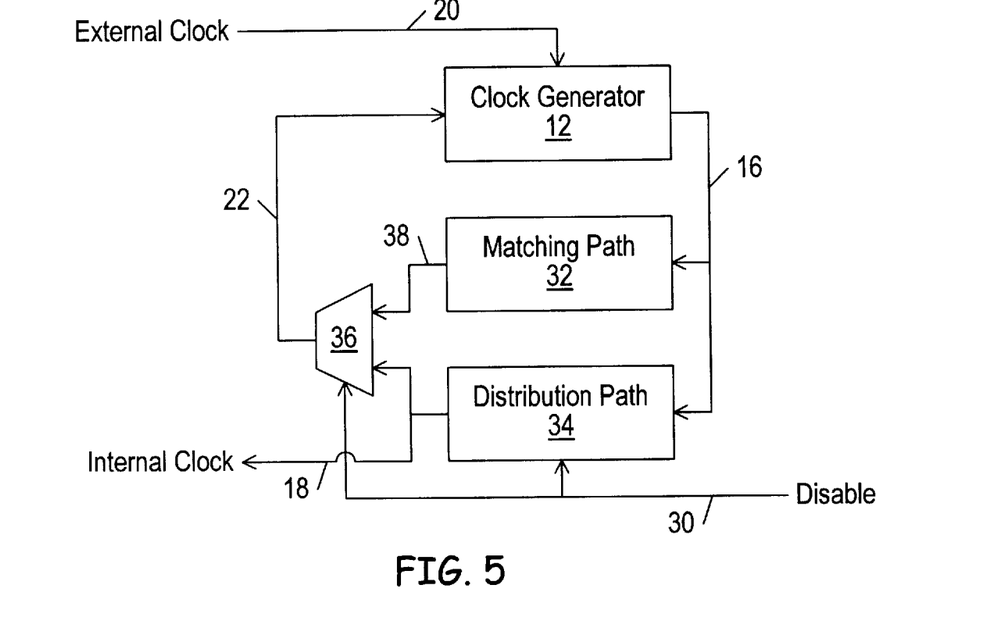
FIG. 5 is a block diagram illustration of one embodiment of a clock generation technique according to the present invention for providing a high-speed internal clock that maintains a phase relationship with an external clock.

Turning now to FIG. 5, a block diagram of a clock source according to one embodiment of the present invention is illustrated. The invention is described herein as being included in an integrated circuit device. However, the clock source of the present invention may be implemented in a system application where the clock source provides a clock signal to multiple integrated circuit devices. In such an application the clock source of the present invention could be implemented discretely or included in one of the integrated circuit devices. For, the following description, it will be assumed the clock source is integrated in a single integrated circuit device such as a microprocesor. However, it is understood that the scope of the present invention is not limited to any particular location for the clock source. The clock source includes clock generator 12 which receives external clock 20 and generates clock signal 16. Clock generator 12 may generate clock signal 16 at a frequency multiple of external clock 20. Clock generator 12 also receives feedback clock 22 and maintains a close phase relationship between feedback clock 22 and external clock 20.

The clock source of FIG. 5 further includes matching path 32 and distribution path 34. Distribution path 34 receives clock signal 16 and distributes it throughout the integrated circuit device as internal clock 18. Distribution path 34 also receives disable signal 30 which when asserted disables distribution path 34 and thus internal clock 18. Matching path 32 provides matching clock 38. Feedback path 36 receives matching clock 38 and internal clock 18 as well as disable signal 30 as a control signal. Depending upon the state of disable signal 30 feedback path 36 selects between matching clock 38 and internal clock 18 to provide as feedback clock 22 to clock generator 12. The elements of FIG. 5 are described in more detail as follows.

The clock source of FIG. 5 may advantageously be used in an integrated circuit device. In one embodiment the integrated circuit device may be a microprocessor coupled to a local bus or system bus in a computer system. External clock 20 may be provided by an external oscillator or may be the bus clock of the bus to which the microprocessor is coupled. Typically, it is desirable for the frequency of the bus clock and thus external clock 20 to run at a slower frequency than the internal clock of the microprocessor, i.e., internal clock 18. This is because the external computer system may be fabricated on a relatively large-scale printed circuit board with correspondingly larger transmission line delays. Furthermore, the other components of the computer system may not be able to operate as fast as the microprocessor. To allow the microprocessor to run at a higher frequency than the external system bus, clock generator 12 receives external clock 20 and multiplies the clock to generate clock signal 16. For example a 66.667 MHz external or bus clock may be multiplied by a factor of three to generate clock signal 16 at a frequency of 200 MHz. The particular frequencies chosen are not a limitation of the present invention. Any suitable frequencies are within the scope of the invention. For example, clock signal 16 may be generated at a frequency of 500 MHz from external clock 20 at a correspondingly divisible lower frequency.

Clock generator 12 may include phase locked loop technology for use in the generation of clock signal 16. The phase locked loop may be constructed as is well understood in the art. The typical phase locked loop includes a phase detector, a filter amplifier and a voltage controlled oscillator. The phase detector receives external clock 20 and feedback clock 22 and provides an output that is a measure of their phase difference. The phase difference output is then filtered and amplified and provided to the voltage controlled oscillator. The phase of the clock generated by the voltage controlled oscillator is adjusted according to the phase difference output so that the voltage controlled oscillator locks to the phase of external clock 20. A counter or other multiplying device is then used to multiply the output of the voltage controlled oscillator to create clock signal 16. Thus, clock signal 16 is a frequency multiple of external clock 20 and is generally in phase with external clock 20.

Distribution path 34 receives clock signal 16 and distributes it as internal clock 18 to the various components of the integrated circuit. Internal clock 18 is used for clocking both the core elements of the integrated circuit device and the I/O interface of the integrated circuit device. Thus, since data is received into the integrated circuit device through the I/O interface at times determined by internal clock 18, no double buffering is required since the core elements are also clocked by internal clock 18. Both the I/O elements and core elements of the integrated circuit device operate in the same time domain. Distribution path 34 may be any clock distribution scheme as is well understood in the art. For example, a buffered common node, a clock tree, or a compressed tree may be used to distribute clock 16 as internal clock 18. In a preferred embodiment distribution path 34 consists of a grid of metal layers within the integrated circuit device.

Distribution path 34 also receives disable signal 30. When disable signal 30 is asserted distribution path 34 and thus internal clock 18 are disabled. Disable signal 30 may be asserted as part of a power management scheme. For example, if the integrated circuit device is a microprocessor and the computer system to which the microprocessor is coupled is inactive or in a sleep state, disable signal 30 may be asserted to conserve power. This is especially useful in hand held or portable devices. Disable signal 30 may also be asserted when power is first supplied to the integrated circuit device to avoid a large initial current draw. Disable signal 30 may also be asserted for certain testing modes or for a variety of other reasons. For more sophisticated power management and power up methods, distribution path 34 may be divided into a plurality of separate distribution structures. In an embodiment in which distribution path 34 comprises multiple distribution structure, disable signal 30 may comprise multiple disable signals-one for each distribution structure. According to the power management scheme, the separate distribution structures may be individually disabled by their respective disable signals. Each distribution structure may distribute clock signal 16 to a different functional section of the integrated circuit device. Thus, according to the power management scheme, power may be reduced by disabling the clock to appropriate sections of the integrated circuit device.

Clock signal 16 is also received by matching path 32. Matching path 32 is designed to approximate the delay of distribution path 34. Matching path 32 may comprise a fixed amount of conductive interconnect patterned to approximate the delay through distribution path 34. Alternatively matching path 32 may include a number of delay elements in addition to interconnect trace wherein the combination of delay elements and interconnect approximates the delay through distribution path 34. The delay through distribution path 34 may vary depending upon the particular element within the integrated circuit device that receives distributed clock signal 16. Thus, matching path 32 may be designed to approximate the average delay through distribution path 34. Alternatively, matching path 32 may be designed to approximate the worst case delay through distribution path 34 or any other approximation of distribution path 34 delay that is convenient or required for a specific design. The output of matching path 32 is matching clock 38. Thus, the delay of matching clock 38 from clock signal 16 approximates the delay of internal clock 18 from clock signal 16.

The clock source of FIG. 5 also includes feedback path 36. Feedback path 36 receives matching clock 38 and internal clock 18. Disable signal 30 is also input to feedback path 36 as a control signal. Feedback path 36 provides feedback clock 22 to the clock generator 12. When disable signal 30 is unasserted feedback path 36 operates in the first mode. In this first mode feedback path 36 selects internal clock 18 to be provided as feedback clock 22. When disable signal 30 is asserted distribution path 34 and thus internal clock 18 are disabled and feedback path 36 operates in a second mode. In this second mode of operation feedback path 36 selects matching clock 38 to provide as feedback clock 22. Feedback clock 36 may comprise a multiplexer where disable signal 30 is the control input to the multiplexer. Matching clock 38 and internal clock 18 are the inputs to the multiplexer and feedback clock 22 is the output from the multiplexer. In the first mode of operation the multiplexer would select internal clock 18 for the feedback clock 22 output and in the second mode of operation the multiplexer would select matching clock 38 to pass through to the feedback clock 22 output.

In embodiments of the present invention where distribution path 34 is divided into multiple distribution structures feedback path 36 will receive internal clock 18 from one of the distribution structures. If the distribution structure from which feedback path 36 receives internal clock 18 is disabled then feedback path 36 will operate in the second mode of operation. However, if some of the distribution structures are disabled, but not the particular structure from which feedback path 36 receives internal clock 18, then feedback path 36 may operate in the first mode of operation.

As noted above, distribution path 34 may comprise a grid structure of two or more metal interconnect layers within the integrated circuit device. In such a grid structure multiple connection points may be provided for from which internal clock 18 may be allotted to feedback path 36. One of these connection points may be selected by adjusting a fabrication mask layer such as one of the final metal layer masks. Thus, the delay of distribution path 34 as received by feedback path 36, may be adjusted.

As noted above, clock generator 12 receives feedback clock 22 from feedback path 36. Clock generator 12 uses feedback clock 22 to adjust the phase of clock signal 16 so that a close phase relationship is maintained between feedback clock 22 and external clock 20. Since in the first mode of operation feedback clock 22 is essentially internal clock 18, a close phase relationship between internal clock 18 and external clock 20 will be maintained. If distribution path 34 and thus internal clock 18 is disabled, feedback path 36 will switch to the second mode of operation in which matching clock 38 will be selected as feedback clock 22. Thus, in the second mode of operation a close phase relationship will be maintained between matching clock 38 and external clock 20. Since the delay of matching path 32 is designed to approximate the delay of distribution path 34, when feedback path 36 is switched back to the first mode of operation, internal clock 18 will substantially be in phase with external clock 20. Thus, the clock source of FIG. 5 provides the clock distribution technique in which the true distribution path 34 is used to provide feedback clock 22 to the clock generator in a first mode and matching path 32 is used to provide feedback clock 22 to the clock generator in a second mode. Thus, clock generator 12 maintains phase lock between feedback clock 22 and external clock 20 in both modes of operation and since the delay through matching path 32 approximates the delay through distribution path 34, internal clock 18 may be disabled and then enabled without losing substantial phase lock to external clock 20.

Matching path 32 is designed to approximate the delay through distribution path 34 as close as possible. However, this is a difficult task. If matching path 32 is routed in only one localized area of the integrated circuit device it may not take into account process variations across the entire integrated circuit device. For example, line widths and other spacings may vary and thus affect the true delay through distribution path 34 in different parts of the integrated circuit device. Therefore, there may be some error in the difference of delay through matching path 32 and distribution path 34. This difference in delay may cause a slight phase error when switching between the two modes of operation for feedback path 36.

Figure 6:
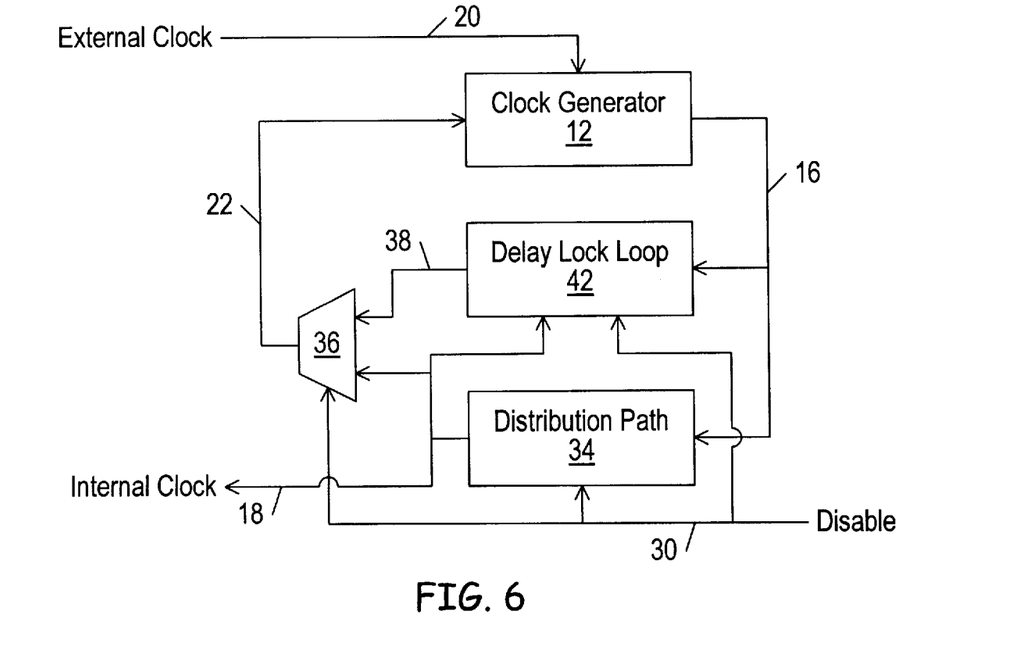
FIG. 6 is a block diagram illustration of another embodiment of a clock generation technique according to the present invention for providing a high-speed internal clock that maintains a phase relationship with an external clock.

A more accurate delay approximation of distribution path 34 may be obtained by using a delay lock loop element in place of matching path 32 as illustrated in FIG. 6. FIG. 6 illustrates another embodiment of a clock source according to the present invention. The clock source of FIG. 6 includes clock generator 12 which receives external clock 20 and provides clock source 16. Clock signal 16 is distributed throughout the integrated circuit device by distribution path 34 as described in FIG. 5. Also, distribution path 34 receives disable signal 30 as described for FIG. 5. Matching path 32 of FIG. 5 is replaced by delay locked loop 32 in FIG. 6. Delay locked loop 32 receives clock signal 16, disable signal 30 and internal clock 18. Delay locked loop 32 also provides matching clock 38 to feedback path 36. Feedback path 36 operates in a first and second mode of operation as described for FIG. 5. Feedback path 36 provides feedback clock 22 to clock generator 12. Clock generator 12 maintains a close phase relationship between feedback clock 22 and external clock 20 by adjusting the phase of clock signal 16 according to the phase difference between feedback clock 22 and external clock 20. The clock source of FIG. 6 operates similarly to the clock source of FIG. 5 except in regard to delay locked loop 42. Delay locked loop 42 is described in further detail as follows.

Figure 7:
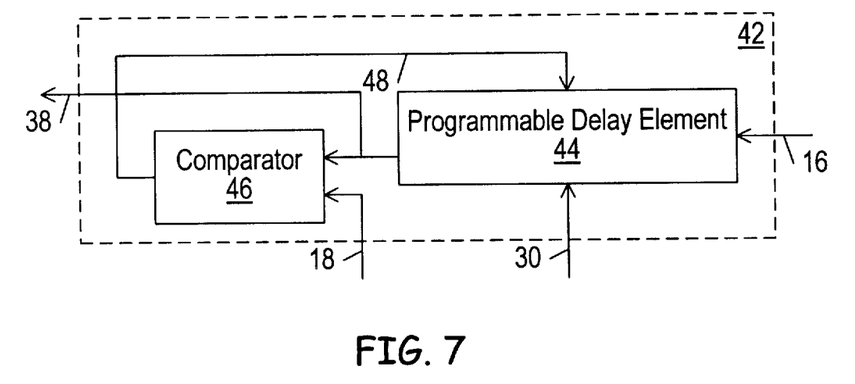
FIG. 7 is a block diagram illustration of one embodiment of a delay locked loop used in the clock generation technique of FIG. 6.

Turning now to FIG. 7, a block diagram of delay locked loop 42 is illustrated. Delay locked loop 42 includes programmable delay element 44 and comparator 46. Programmable delay element 44 receives clock signal 16, disable signal 30 and comparator output 48. Comparator 46 receives the output of programmable delay element 44, internal clock 18 and provides comparator output 48. Delay locked loop 42 operates as follows.

Clock signal 16 is delayed through programmable delay element 44 and output as matching clock 38. Comparator 46 compares internal clock 18 to matching clock 38 and provides comparator output 48 as a measure of the difference in delay between internal clock 18 and matching clock 38. Programmable delay element 44 adjusts the delay by which clock signal 16 is delayed according to comparator output 48. Thus, programmable delay element 44 adjusts the delay of matching clock 38 from clock signal 16 to match the delay of internal clock 18 from clock signal 16. In other words the delay of matching clock 38 is locked to the delay of internal clock 18.

Programmable delay element 44 may include any delay structure as is well known in the art. For example, the delay through programmable delay element 44 may be adjusted by controlling a variable current source that controls the current through a series of delay elements. A variable voltage source may similarly be used in conjunction with delay elements to adjust the delay through programmable delay element 44. Alternatively, capacitive loads on a number of delay elements may be adjusted to change the delay to delay element 44. Also, the number or sizing of delay elements may be changed to adjust the delay to programmable delay element 44. Programmable delay element 44 also receives disable signal 30. When disable signal 30 is asserted and thus feedback path 36 operates in a second mode of operation in which matching clock 38 is selected as feedback clock 22 the delay through programmable element 44 will be fixed. Thus, disable signal 30 acts as a control signal to programmable delay element 44 to lock in the delay through programmable delay element 44 during the second mode of operation. During the first mode of operation when disable signal 30 is unasserted, the delay through programmable element 44 will continuously be adjusted to match the delay through distribution path 34. Thus delay locked loop 32 continuously learns the delay of distribution path 34 during the first mode of operation and locks in on that delay during the second mode of operation. Slight phase errors may still result when switching between the first and second modes of operation and back again due to delay variations over time resulting, for example, in changes in temperature. However, delay locked loop 42 may provide a very accurate matching of the delay through delay path 34. Thus, the clock source of FIG. 6 provides a clock distribution technique in which a very close phase relationship is maintained between internal clock 18 and external clock 20 during the first mode of operation and wherein a close phase relationship is maintained between matching clock 38 and external clock 20 during a second mode of operation. Since the delay of matching clock 38 very closely approximates the delay of internal clock 18 a close phase relationship between internal clock 18 and external clock 20 will immediately be restored when distribution path 34 is enabled. In other words the clock source of FIG. 2 maintains a continuous phase lock to external clock 20.

Figure 8:
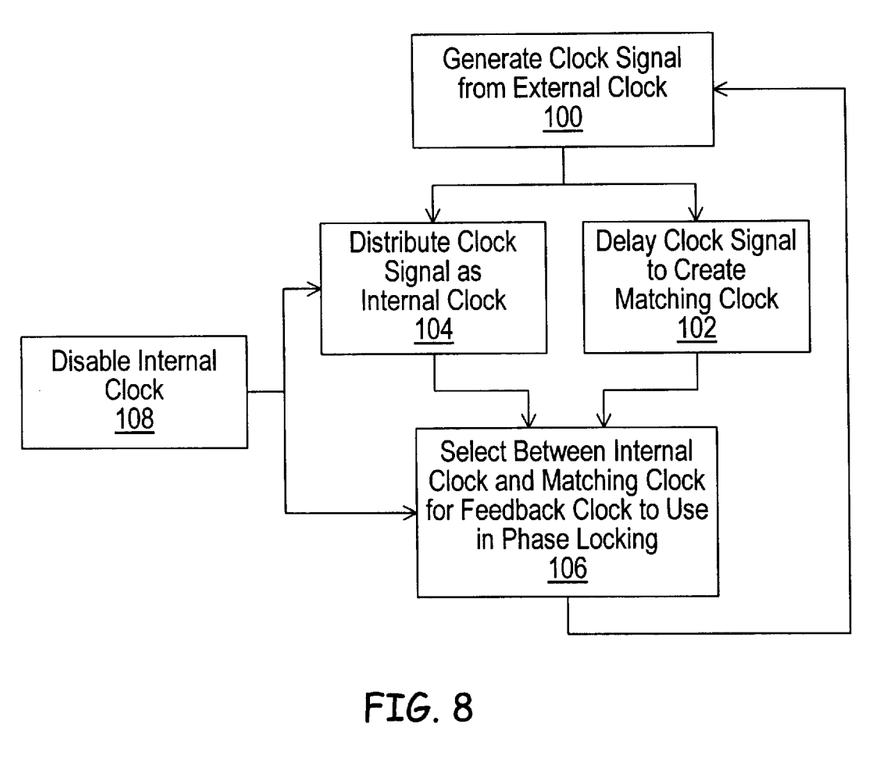
FIG. 8 is a flow chart representing a method according to one embodiment of the present invention for providing a high-speed internal clock that maintains a phase relationship with an external clock.

Turning now to FIG. 8, a flow chart is provided illustrating a clock distribution method according to the present invention. The method includes generating a clock signal from an external clock (step 100) and distributing the clock signal as an internal clock (step 104) while delaying the clock signal to create a matching clock (step 102). The method further includes selecting between the internal clock and the matching clock to use in phase locking to the external clock (step 106). The method also includes disabling the internal clock (step 108) where the matching clock from step 102 is selected in step 106 when the internal clock is disabled and where the internal clock from step 104 is selected in step 106 when the internal clock is not disabled.

The present invention encompasses the use of multiple feedback paths in a clock source for an integrated circuit device to maintain phase lock to an external clock. It is further contemplated by the present invention that feedback paths are provided from the internal clock distribution path and from a matching path that approximates the delay of the clock distribution path. The matching path may comprise a delay locked loop. Feedback from the clock distribution path is used in normal operation and feedback from the matching path is used when the internal clock distribution path is disabled. The clock source of the present invention also may implement power management functions.

It will be appreciated to those skilled in the art having the benefit of this disclosure that this invention is capable of applications with numerous types of numerous semiconductor processes for creating integrated circuits. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. An integrated circuit device, comprising a clock generator configured to receive an external clock and a feedback clock and to provide a clock signal, said clock generator configured to maintain approximate phase consistency between said external clock and said feedback clock;

a clock distribution path configured to receive said clock signal and to distribute said clock signal to circuits included in the integrated circuit device as an internal clock;

a matching path configured to receive said clock signal from said clock generator, to receive said internal clock from said clock distribution path, and to provide a matching clock, wherein said matching path comprises a delay locked loop circuit configured to approximate performance characteristics of said clock distribution path; and a feedback path configured to provide said feedback clock, wherein said feedback path is configured to select said feedback clock as said internal clock from said clock distribution path in a first mode and as said matching clock from said matching path in a second mode.

2. The integrated circuit device as recited in claim 1, wherein said clock distribution path is disabled in said second mode.

3. The integrated circuit device as recited in claim 1, wherein said feedback path comprises a multiplexer.

4. The integrated circuit device as recited in claim 1, further comprising a disable signal, wherein said feedback path operates in said first mode when said disable signal is unasserted and operates in said second mode when said disable signal is asserted, and wherein said clock distribution path is disabled when said disable signal is asserted.

5. The integrated circuit device as recited in claim 1, wherein said delay locked loop circuit comprises a programmable delay element and a comparator configured to match a delay of said clock distribution path.

6. The integrated circuit device as recited in claim 5, wherein said programmable delay element comprises a plurality of delay elements through which said clock signal passes to form said matching clock, and wherein said comparator is configured to compare said internal clock from said clock distribution path to said matching clock and responsively adjust the number of delay elements through which said clock signal passes in said delay locked loop circuit.

7. The integrated circuit device as recited in claim 6, wherein the number of delay elements through which said clock signal passes in said delay locked loop circuit is fixed in said second mode.

8. The integrated circuit device as recited in claim 1, wherein said clock signal is of a higher frequency than said external clock by a multiple of the frequency of said external clock.

9. The integrated circuit device as recited in claim 1, wherein said clock distribution path comprises a grid structure.

10. The integrated circuit device as recited in claim 1, wherein said distribution path comprises metal layers in the integrated circuit device, wherein a plurality connection points are provided in said distribution path from which said feedback path may select said feedback clock in said first mode, wherein one of said plurality of connection points is selected according to a metal layer fabrication mask.

11. The integrated circuit device as recited in claim 1, wherein said clock distribution path comprises a plurality of distribution structures configured to be separately disabled for power management.

12. The integrated circuit device as recited in claim 11, wherein said feedback path selects said feedback clock from one of said plurality of distribution structures in said first mode, wherein said feedback path operates in said second mode when the distribution structure from which said feedback path selects said feedback clock is disabled.

13. The integrated circuit device as recited in claim 11, wherein said feedback path operates in said second mode when power is initially applied to the integrated circuit device and wherein select ones of said plurality of distribution structures are enabled sequentially as power is applied to the integrated circuit device.

14. The integrated circuit device as recited in claim 1, wherein said clock generator comprises a phase locked loop.

15. The integrated circuit device of claim 1, further comprising a microprocessor core, wherein said clock distribution path distributes said clock signal to said microprocessor core.

16. The integrated circuit device as recited in claim 15, wherein said external clock comprises a bus clock from a computer system bus to which the integrated circuit device is coupled.

17. A clock source, comprising
 a clock generator configured to produce a clock signal responsive to an external clock and responsive to a feedback clock; and
 a delay locked loop path and a distribution path having substantially similar delay characteristics, wherein said delay locked loop path and said distribution path each receive said clock signal, and wherein said feedback clock is selectively provided by either said delay locked loop path or said distribution path.

18. The clock source as recited in claim 17, wherein said delay locked loop path is selected to provide said feedback clock during times when said distribution path is disabled.

19. The clock source as recited in claim 17, wherein said delay locked loop path is configured to compare a clock signal as outputted from a distribution path to said clock signal as outputted from said delay locked loop path and responsively adjust the delay of said delay locked loop path.

20. A clock distribution method, comprising
 generating a clock signal from an external clock;
 distributing said clock signal in an integrated circuit device to provide an internal clock;
 delaying said clock signal to provide a matching clock, wherein the delay of said matching clock from said clock signal substantially matches the delay of said internal clock from said clock signal, wherein said delaying comprises comparing said matching clock to said internal clock and adjusting the delay of said matching clock to approximately match the delay of said internal clock; and
 selecting between said internal clock and said matching clock to use in phase locking to said external clock.

21. The clock distribution method as recited in claim 20, further comprising disabling said internal clock, wherein during said disabling said matching clock is selected by said selecting.

\* \* \* \* \*